United States Patent
Kubota et al.

(10) Patent No.: US 10,903,093 B2
(45) Date of Patent: Jan. 26, 2021

(54) HEATING DEVICE

(71) Applicant: KELK Ltd., Hiratsuka (JP)

(72) Inventors: Kazuhiko Kubota, Kanagawa (JP); Atsushi Kinoshita, Hiratsuka (JP); Koji Maeda, Hiratsuka (JP); Keisuke Ishii, Hiratsuka (JP)

(73) Assignee: KELK Ltd., Kanagawa (JP)

( * ) Notice: Subject to any disclaimer, the term of this patent is extended or adjusted under 35 U.S.C. 154(b) by 370 days.

(21) Appl. No.: 15/539,833

(22) PCT Filed: Mar. 4, 2016

(86) PCT No.: PCT/JP2016/056821
§ 371 (c)(1),
(2) Date: Jun. 26, 2017

(87) PCT Pub. No.: WO2016/147912
PCT Pub. Date: Sep. 22, 2016

(65) Prior Publication Data
US 2018/0182648 A1    Jun. 28, 2018

(30) Foreign Application Priority Data

Mar. 17, 2015    (JP) .................................. 2015-053793

(51) Int. Cl.
*H01L 21/67* (2006.01)
*H01L 21/687* (2006.01)

(52) U.S. Cl.
CPC .. *H01L 21/67103* (2013.01); *H01L 21/68785* (2013.01); *H01L 21/67017* (2013.01)

(58) Field of Classification Search
CPC ......... H01L 21/68785; H01L 21/67017; H01L 21/67103; H01L 23/15; H01L 23/10; H05B 3/74; H05B 3/68; H05B 3/10; C23C 16/00

(Continued)

(56) References Cited

U.S. PATENT DOCUMENTS 6,465,763 B1 * 10/2002 Ito ..................... H01L 21/67103
                                                                118/725
2002/0190051 A1 * 12/2002 Wang .................. C23C 16/0209
                                                                219/390

(Continued)

FOREIGN PATENT DOCUMENTS

| JP | 2001-345370 | 12/2001 |
| JP | 2002-184557 | 6/2002 |
| JP | 2003-318097 | 11/2003 |

OTHER PUBLICATIONS

International Search Report and Written Opinion for International Application No. PCT/JP2016/056821, dated May 17, 2016, 8 pages, with English translation.

(Continued)

*Primary Examiner* — Tu B Hoang
*Assistant Examiner* — Diallo I Duniver
(74) *Attorney, Agent, or Firm* — Fish & Richardson P.C.

(57) ABSTRACT

A heating device includes: a baseplate; a faceplate provided above the baseplate, the faceplate including a film heater configured to heat a wafer mounted on an upper surface of the faceplate; a sleeve provided between the baseplate and the faceplate, the sleeve including a sleeve body having a vertical through-hole; and a support bolt penetrating the through-hole in the sleeve to support the faceplate on the baseplate, in which a distance from a central axis of the through-hole in the sleeve to a flat surface of an outer portion of the sleeve is less than a distance from the central axis of the through-hole to a locking surface of an inner portion of the sleeve.

10 Claims, 3 Drawing Sheets

(58) Field of Classification Search
USPC .......... 219/444.1, 443.1, 390, 538–553, 520,
219/468.1, 465.1; 118/728, 725, 720,
118/722, 425; 257/701, 703, 705, 708,
257/710, 690, 692, 693
See application file for complete search history.

(56) References Cited

U.S. PATENT DOCUMENTS

| | | | | |
|---|---|---|---|---|
| 2004/0226935 | A1* | 11/2004 | Furukawa | H01L 21/67103 219/444.1 |
| 2006/0096972 | A1* | 5/2006 | Nakamura | H01L 21/67103 219/444.1 |
| 2006/0231029 | A1* | 10/2006 | Blonigan | H01J 37/32082 118/722 |

OTHER PUBLICATIONS

International Preliminary Report on Patentability in International Application No. PCT/JP2016/056821, dated Sep. 19, 2017, 5 pages (with English translation).

\* cited by examiner

HEATING DEVICE

CROSS-REFERENCE TO RELATED APPLICATIONS

This application claims priority to International Application No. PCT/JP2016/056821 filed on Mar. 4, 2016, which claims priority to Japanese Application No. 2015-053793, filed Mar. 17, 2015, the contents of which are incorporated herein in their entirety.

TECHNICAL FIELD

The present invention relates to a heating device, for instance, to a heating device configured to heat a semiconductor wafer to a predetermined temperature.

BACKGROUND ART

In a coater-developer used for pattern printing and the like on a semiconductor wafer, a heating device heats the wafer to a predetermined temperature.

Existing heating devices are provided with a baseplate and a disc-shaped faceplate above the baseplate. The faceplate is heated by a heating unit such as a resistance heating element or the like provided on a lower surface of the faceplate. Heat propagates from the heated faceplate to the wafer to heat the wafer. The faceplate in such a heating device is supported by a plurality of support members located outside an area where the wafer is mounted. The support members are cylindrical resin spacers including support bolts inserted therethrough, the support bolts supporting the faceplate on the baseplate. Given that the support members are resin-made, the heating device prevents heat from escaping from the faceplate to a bottom plate.

In addition, the support members are arranged near a rim of the wafer in typical heating devices. Heat travels from a heating unit through the faceplate to the wafer. The above typical heating devices may result in so-called heat loss, where a portion of the heat traveling to the wafer escapes from the faceplate to the metal case via the support members. When this happens, the heat escapes from the rim of the wafer, increasing the effect of heat on the wafer due to the heat loss and thus tends to cause uneven heating to the wafer. A demand for the heating devices is currently increasing, where it is increasingly required to prevent such an uneven heating.

One known method for preventing uneven heating is to reduce the diameter of the bolt at the middle, which prevents heat from escaping. However, merely reducing the diameter of the bolt at the middle cannot sufficiently prevent the uneven heating.

The uneven heating of the wafer could be prevented if it were possible to provide the support members further outside the rim of the wafer. However, due to the limitation on the outer diameter of the faceplate where the support members are provided, it is not possible to provide the support members further outside the rim of the wafer.

In a typical heating device having another support structure and described in Patent Literature 1, the device is provided with a disc-shaped ceramic plate (i.e., a faceplate) above a bottomed cylindrical metal case. The ceramic plate is bolted to the metal case (the baseplate) via ring-shaped contact members (support members) which are in contact with the lower surface of the rim. A cross section of each of the contact members is symmetrical about a central axis of a through-hole through which the bolt is inserted vertically.

CITATION LIST

Patent Literature(S)

Patent Literature 1: JP 2003-318097 A

SUMMARY OF THE INVENTION

Problem(s) to be Solved by the Invention

In the heating device in Patent Literature 1, a contact portion of each of the contact members is arranged between the metal case and the ceramic plate near the rim of the wafer. Heat travels from a heating unit through the ceramic plate to the wafer. The device may result in so-called heat loss, where a portion of the heat traveling to the wafer escapes from the faceplate to the metal case via the support members. When this happens, the heat escapes from the rim of the wafer, increasing the effect of heat on the wafer due to the heat loss and thus tends to cause uneven heating to the wafer.

An object of the invention is to provide a heating device capable of preventing an uneven heating of a wafer.

Means for Solving the Problem(s)

According to an aspect of the invention, a heating device includes: a baseplate; a faceplate provided above the baseplate, the faceplate including a heating unit configured to heat a wafer mounted on an upper surface of the faceplate; a sleeve provided between the baseplate and the faceplate, the sleeve comprising a sleeve body through which a through-hole is vertically formed; and a support bolt penetrating the through-hole in the sleeve and supporting the faceplate on the baseplate, in which a distance from a central axis of the through-hole in the sleeve to an outer circumferential surface on an outer portion of the sleeve is smaller than a distance from the central axis of the through-hole to an outer circumferential surface on an inner portion of the sleeve.

According to the above aspect of the invention, since the distance from the central axis of the through-hole in the sleeve to the outer circumferential surface on the outer portion of the sleeve is smaller than the distance inward from the central axis of the through-hole to the outer circumferential surface on the inner portion of the sleeve, the support bolt can be provided further outward while the sleeve is kept free from deviating beyond the baseplate and the faceplate. Accordingly, even if heat escapes via the support bolt, this heat loss occurs on a further outer portion, specifically, at a portion apart further outward from the rim of the wafer; consequently, this can reduce the effect of heat loss on the wafer W to suppress uneven heating of the wafer W.

In the heating device with the above arrangement, the sleeve preferably includes a stepped portion in a form of a cutout at a top end of the inner portion.

In the heating device with the above arrangement, the inner portion of the sleeve preferably has a locking surface locked with an opposing surface of the baseplate.

In the heating device with the above arrangement, the outer portion of the sleeve preferably has a flat surface vertically formed, and the flat surface and the locking surface of the sleeve define two sides forming a width of the sleeve body.

BRIEF DESCRIPTION OF DRAWING(S)

DESCRIPTION OF EMBODIMENT(S)

Exemplary embodiment(s) of the invention will be described below with reference to the attached drawings.

Figure 1:
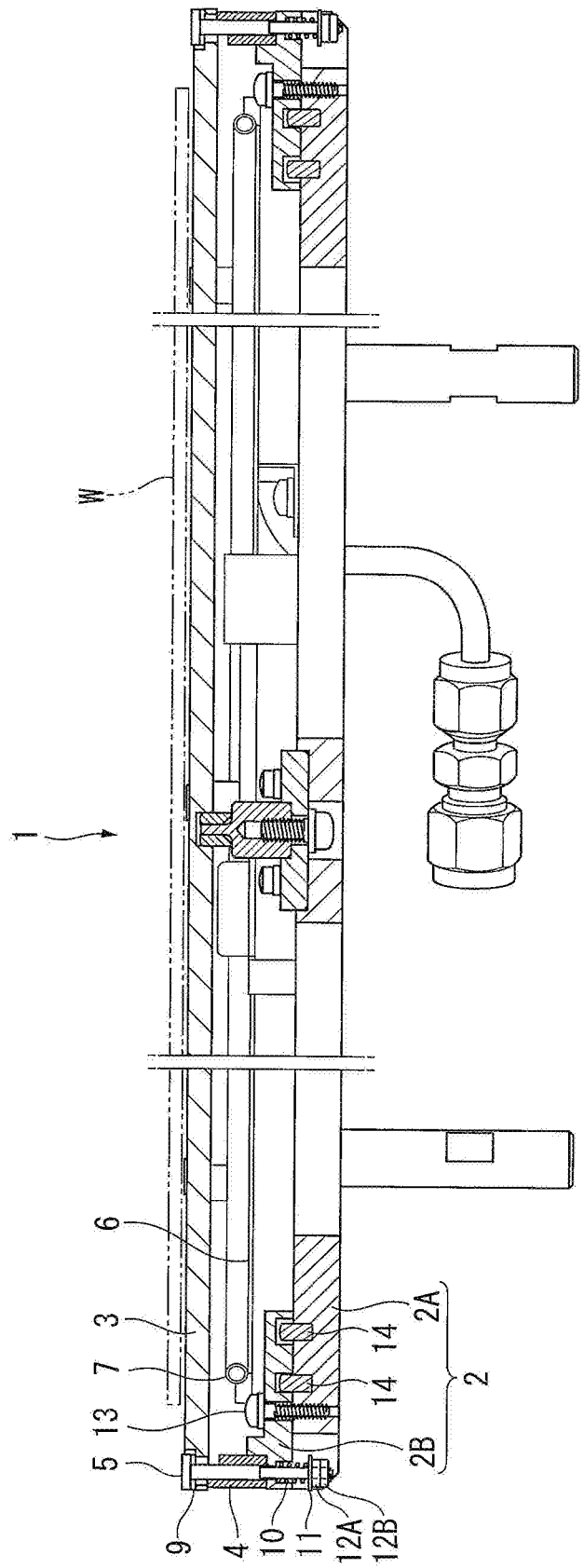
FIG. 1 is a lateral cross-sectional view illustrating a heating device according to an exemplary embodiment of the invention.

FIG. 1 is a lateral cross-sectional view illustrating a heating device 1 according to an exemplary embodiment of the invention.

Overview of Structure and Operation of Heating Device

A heating device 1 is installed in a coater-developer used in a semiconductor manufacturing process. The heating device 1 is configured to heat a semiconductor wafer (referred to below simply as "wafer") W such as a silicon wafer represented by a long dash double dotted line in the drawings to a predetermined temperature in accordance with various steps such as a pattern printing step.

The heating device 1 includes: a disc-shaped baseplate 2 and a disc-shaped faceplate 3 that is concentric with the baseplate 2 and provided above the baseplate 2. The faceplate 3 is secured to the baseplate 2 via eight support bolts 5 (with only two bolts illustrated in FIG. 1 and one bolt illustrated in FIG. 2) respectively inserted through eight sleeves 4. A disc-shaped heat-shield rectifying plate 6 and a ringed cooling pipe 7 are housed between the baseplate 2 and the faceplate 3.

In the heating device 1 which is kept at a predetermined temperature with a hoisting pin kept raised from an insertion hole (not shown) in the faceplate 3, a robot hand or the like conveys a wafer W into the heating device 1 to place the wafer W onto an upper end of the hoisting pin. After the robot hand retracts, the hoisting pin is lowered. In conjunction with the lowered hoisting pin, the wafer W is lowered to be mounted on the faceplate 3 via a gap ball or the like so that the wafer W and the faceplate 3 are separated by a predetermined gap. The wafer W is heated via heat transfer from the faceplate 3 and is kept at a predetermined temperature. After the heat treatment of the wafer W is finished, the hoisting pin is again raised and the raised wafer W is exchanged by a next wafer W. When processing conditions for a wafer W are changed, for instance, when a temperature of the faceplate 3 is changed from a high temperature to a low temperature, coolant gas may be injected from the cooling pipe 7 to cool the faceplate 3.

Description of Baseplate

The baseplate 2 includes a disc-shaped plate body 2A and a plurality of edge blocks 2B. Each of the edge blocks 2B (hereinafter also referred to as "the edge block 2B") is layered on the rim of the plate body 2A and fastened to the plate body 2A via a screw 13, a pin 14 and the like. Both the plate body 2A and the edge block 2B are made of a stainless steel plate. A plurality of openings may be formed in the plate body 2A to make the plate body 2A lightweight. The plate body 2A may also include an exhaust port in the center for expelling the coolant gas used to cool the faceplate 3.

Description of Faceplate

Figure 2:
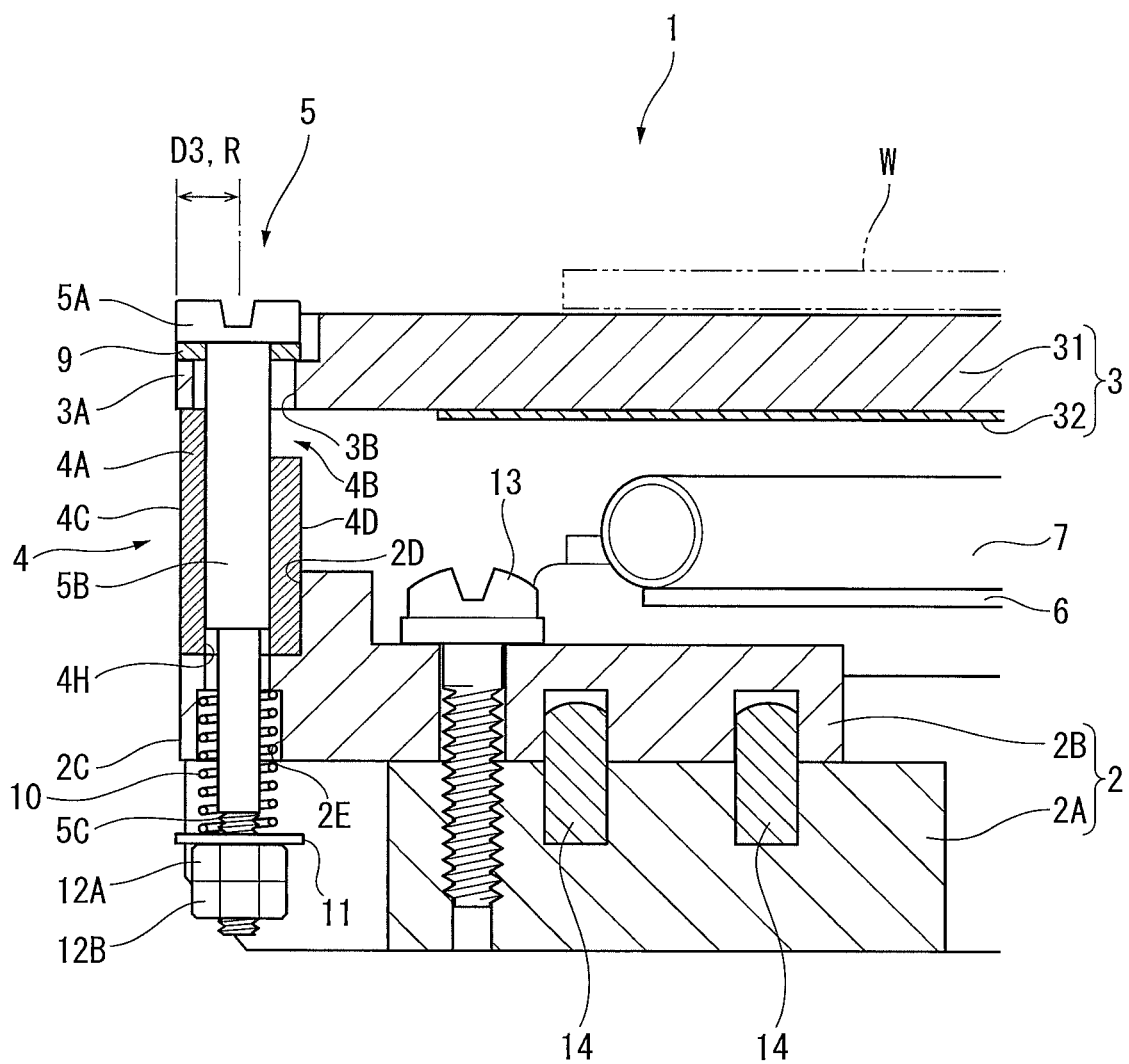
FIG. 2 is a lateral cross-sectional view illustrating a support structure for a faceplate.

As illustrated in FIG. 2, the faceplate 3 includes: an aluminum substrate 31; and a film heater 32 (heating unit) attached to a lower surface of the aluminum substrate 31 by hot pressing.

The aluminum substrate 31 may be, for instance, 4.0 mm thick; the surface of the aluminum substrate 31 is treated with anodized aluminum to form an anodized aluminum layer. In addition to the upper and lower surfaces and the outer circumference of the aluminum substrate 31, wall surfaces of the through-holes formed at various positions are also treated with anodized aluminum. The aluminum substrate 31 is relatively thick and thus warps less due to heat expansion when heated.

The film heater 32 attached to the lower surface of the aluminum substrate 31 includes: a heat-generating circuit pattern made of a stainless steel foil and provided on a surface of a base film; and a cover film covering the circuit pattern. The base film and the cover film in this exemplary embodiment are made from a polyamide resin.

The faceplate 3 with the above arrangement is configured to supply the stainless steel foil in the film heater 32 with electricity, thereby heating the aluminum substrate 31. When the aluminum substrate 31 is heated, the wafer W mounted on the faceplate 3 is also heated by way of the gas present directly above the entire faceplate 3. At this point, the temperature is controlled by adjusting the supply of electricity to the film heater 32 on the basis of a detection signal from a temperature sensor (not shown) embedded in the aluminum substrate 31.

Description of Support Bolt

Each of the support bolts 5 (hereinafter also referred to as "the support bolt 5") is made of stainless steel, for example. The support bolt 5 includes, from top to bottom in the drawing, a bolt head 5A, a stepped column 5B, and a male threaded screw 5C. In the exemplary embodiment, the bolt head 5A is 6 mm in diameter; the large diameter portion of the stepped column 5B is 3 mm and a small diameter portion is 2 mm; and the male threaded screw 5C has a nominal diameter of M2.

Description of Sleeve

Each of the sleeves 4 (hereinafter, also referred to as "the sleeve 4") is provided with a sleeve body 4A that includes a through-hole 4H having a vertically oriented central axis X, and is produced by cutting a cylindrical resin material. Here, the resin material with excellent thermal resistance, low thermal conductivity, and little susceptibility to thermal deformation is used. Note that the sleeve 4 may be produced via injection molding or via press processing.

Figure 3:
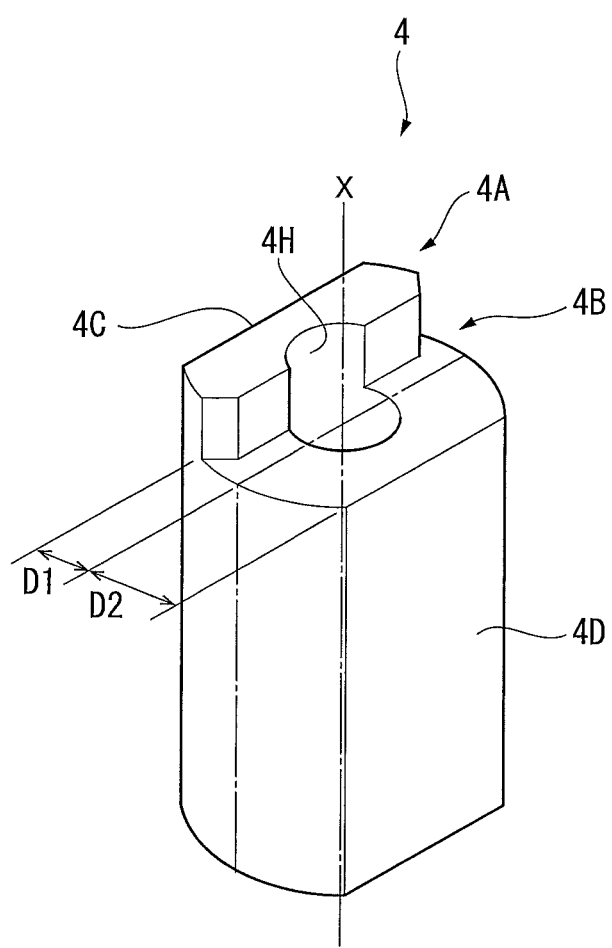
FIG. 3 is a perspective view of a sleeve.

As illustrated in FIG. 1 through FIG. 3, a stepped portion 4B is in a form of a cutout at a top end of an inner portion of the sleeve 4 and a gap is formed between the stepped portion 4B and a lower surface of the faceplate 3. Portions other than the stepped portion 4B at an upper surface of the sleeve 4 abut the lower surface of the faceplate 3, and a lower surface of the sleeve 4 abuts the upper surface of the edge block 2B.

The sleeve 4 also includes a flat surface 4C in a form of a vertical cutout. The flat surface 4C is formed as an outer circumferential surface positioned on an outer portion with respect to the central axis X of the through-hole 4H. As illustrated in FIG. 1 and FIG. 2, the sleeve 4 is installed so that the flat surface 4C is oriented substantially flush with an outer circumferential surface 2C of the edge block 2B and the outer circumferential surface 3A of the faceplate 3.

In addition, the stepped portion 4B, which forms a gap together with the faceplate 3 therebetween, is arranged near the film heater 32; therefore, this makes it possible to avoid heat escaping to the sleeve 4 and interference with the sleeve 4 while allowing the film heater 32 to be extended further outward.

The sleeve 4 includes an locking surface 4D located parallel to the flat surface 4C and on the inner portion of the sleeves 4 with respect to the central axis X. The flat surface 4C and the locking surface 4D define two sides forming the width of the sleeve body 4A. A distance D1 from the central axis X to the flat surface 4C is less than a distance D2 from the central axis X to the locking surface 4D. Therefore, with respect to the central axis X of the through-hole 4H, the outer portion having the flat surface 4C is formed thin, while the inner portion having the locking surface 4D is formed thicker. As a result, compared to when the sleeve body 4A is perfectly cylindrical, the sleeve 4 can be brought further outward by a difference in thickness between the outer portion and the inner portion. Additionally, the through-hole 4H and the support bolt 5 passing therethrough may also be positioned further outward.

As illustrated in FIG. 1 and FIG. 2, the locking surface 4D is locked with the stepped surface 2D of the edge block 2B. This locking disables the sleeve 4 to rotate around the support bolt 5 passing through the central axis X. Consequently, the flat surface 4C is kept substantially flush with the outer circumferential surface 2C of the edge block 2B and the outer circumferential surface 3A of the faceplate 3.

Description of Faceplate Support Structure

Next, a support structure of the faceplate 3 is described with reference to FIG. 1 and FIG. 2.

As above described, the faceplate 3 is supported on the baseplate 2 via the sleeve 4 and the support bolt 5.

Eight through-holes 3B are formed in the rim of the faceplate 3, passing vertically therethrough (only two through-holes illustrated in FIG. 1 and one through-hole illustrated in FIG. 2). The through-holes 3B are disposed at equal intervals in a form of a step provided by a counterboring processing from above in the drawing. In the exemplary embodiment, the distance D3 from the outer circumferential surface 3A of the faceplate 3 to the through-holes 3B is equal to a radius R of the bolt head 5A of the support bolt 5. Therefore, the outer circumferential surface 3A of the faceplate 3 and the outer circumferential surface of the bolt head 5A of the support bolt 5 are arranged flush with each other in FIG. 1 and FIG. 2.

Eight through-holes 2E are formed in the rim of the edge blocks 2B in the baseplate 2, passing vertically therethrough (only two through-holes illustrated in FIG. 1, and one through-hole illustrated in FIG. 2). The through-holes 2E each are in a form of a step provided by a counterboring processing from below in the drawing. The through-holes 2E are formed at positions corresponding to the above described through-holes 3B in the faceplate 3.

The support bolt 5 is inserted from above in the drawing through the through-hole 3B in the faceplate 3, the through-hole 4H in the sleeve 4, and the through-hole 2E in the baseplate 2.

As illustrated in FIG. 2, when the support bolt 5 is inserted, the bolt head 5A is buried in the through-hole 3B of the faceplate 3, while the stepped column 5B of the support bolt 5 is inserted through a thermally insulating flat washer 9, the sleeve 4, and a coil spring 10. The male-threaded screw 5C is inserted through a flat washer 11 located at the lower surface of the baseplate 2, and is threaded through a tightening nut 12A and a lock nut 12B.

The thermally insulating flat washer 9 is made of a synthetic resin having thermal resistance and low thermal conductivity. The thermally insulating flat washer 9 is housed inside the through-hole 3B of the faceplate 3 and sandwiched between the head 5A of the support bolt 5 and the seat of the through-hole 3B. Providing the thermally insulating flat washer 9 minimizes heat escaping via the support bolt 5.

The upper end of the coil spring 10 is inserted into the through-hole 2E of the baseplate 2 from below; the coil spring 10 is sandwiched between the seat of the through-hole 2E and the flat washer 11 and is pressed in accordance with the tightening of the tightening nut 12A.

The bias from the coil spring 10 pulls the faceplate 3 downward and presses the faceplate 3 onto the sleeve 4. Providing the coil spring 10 allows the heating device 1 to prevent the warp of the faceplate 3, while adequately supporting the faceplate 3 on the baseplate 2.

According to the heating device 1 in the above exemplary embodiment, the distance D1 from the central axis X to the flat surface 4C on the outer portion of the sleeve 4 is smaller than the distance D2 from the central axis X to the locking surface 4D on the inner portion of the sleeve 4, so that the outer portion is thinner than the inner portion. Therefore, the sleeve 4 can be disposed further outside the faceplate 3 by a difference in thickness between the outer portion and the inner portion, thereby allowing the through-hole 4H of the sleeve 4 and the support bolt 5 passing through the through-hole 4H to be arranged further outside the rim of the wafer W. Accordingly, even if heat escapes via the sleeve 4, this heat loss occurs on a further outer portion, specifically, at a portion apart further outward from the rim of the wafer W; consequently, this can reduce the effect of heat loss on the wafer W to suppress uneven heating of the wafer W.

It should be understood that the scope of the invention is not limited to the above-described exemplary embodiment(s) but includes modifications and improvements as long as the modifications and improvements are compatible with the invention.

For instance, in the above exemplary embodiment, the sleeve 4 is substantially cylindrical, however, the sleeve 4 may be a polygonal pillar, including a square pillar having a rectangular cross section.

The sleeve body 4A of the sleeve 4 may be provided as a column or a polygonal pillar without providing the flat surface 4C. In this case, the central axis X of the through-hole 4H may be eccentric outward relative to the central axis of the sleeve body 4A, thereby shortening the distance from that outer circumference, and placing the support bolt 5 further outward.

In the above exemplary embodiment, the locking surface 4D of the sleeve 4 is formed parallel to the flat surface 4C; however, the locking surface 4D is not necessarily parallel to the flat surface 4C as long as the locking surface 4D is locked on the stepped surface 2D of the edge block 2B to restrict rotation of the sleeve 4. Additionally, the locking surface 4D is not necessarily formed extending from the lower end of the stepped portion 4B to the lower end of the sleeve body 4A; the locking surface 4D only needs to be formed in size sufficient to abut the stepped surface 2D of the edge block 2B.

The number of the sleeve 4 and the support bolt 5 is also not limited to eight. However, the respective diameters of the sleeve 4 and the support bolt 5 are determined in accordance with the number thereof. When the number of the sleeve 4 and the support bolt 5 is smaller, the respective diameters of the sleeve 4 and the support bolt 5 needs to be larger in order to guarantee support strength, so that the sleeve 4 and the support bolt 5 cannot be sufficiently distanced from the film heater 32. For this reason, the number of the sleeve 4 and the support bolt 5 is preferably equal to or more than a predetermined number (e.g., five).

The invention claimed is:

1. A heating device comprising:
   a baseplate;
   a faceplate provided above the baseplate, the faceplate comprising a heating unit configured to heat a wafer mounted on an upper surface of the faceplate and a through-hole penetrating the faceplate from the upper surface to a lower surface of the faceplate facing the heating unit;
   a sleeve provided between the baseplate and the faceplate, the sleeve comprising a sleeve body through which a through-hole is vertically formed; and
   a support bolt penetrating the through-hole of the faceplate and the through-hole of the sleeve and supporting the faceplate on the baseplate, wherein
   the sleeve comprises an inner portion disposed at a first side with respect to the through-hole of the sleeve facing the heating unit, and an outer portion disposed at a second side opposite to the first side with respect to the through-hole of the sleeve,
   a distance from a central axis of the through-hole of the sleeve to an outer surface of the outer portion of the sleeve is smaller than a distance from the central axis of the through-hole of the sleeve to an outer surface of the inner portion of the sleeve, and
   each of an outer circumferential surface of the baseplate and the outer surface of the outer portion of the sleeve is substantially flush with or positioned inward relative to an outer circumferential surface of the faceplate,
   wherein the sleeve comprises a stepped portion in a form of a cutout at a top end of the inner portion, and
   wherein the sleeve and the faceplate define a space vertically between the top end of the inner portion of the sleeve and the lower surface of the faceplate.

2. The heating device according to claim 1, wherein the inner portion of the sleeve comprises a locking surface locked with an opposing surface of the baseplate.

3. The heating device according to claim 2, wherein the outer portion of the sleeve comprises a flat surface vertically formed, and
   the flat surface and the locking surface of the sleeve define two sides forming a width of the sleeve body.

4. The heating device according to claim 1, wherein an inner surface of each of the inner portion and the outer portion defines an inner circumferential surface of the sleeve that faces the support bolt.

5. The heating device according to claim 1, wherein the outer surface of each of the inner portion and the outer portion defines at least a portion of an outside surface of the sleeve.

6. The heating device according to claim 1, wherein the top end of the inner portion of the sleeve is spaced apart from the lower surface of the faceplate, and
   a top end of the outer portion of the sleeve contacts the lower surface of the faceplate.

7. The heating device according to claim 1, wherein the outer surface of each of the inner portion and the outer portion is a flat surface that extends vertically.

8. The heating device according to claim 7, wherein a lower portion of the outer surface of the inner portion is in surface contact with the baseplate.

9. The heating device according to claim 6, wherein the top end of the outer portion of the sleeve is in direct contact with the lower surface of the faceplate.

10. The heating device according to claim 6, wherein a height of the inner portion of the sleeve between the top end of the inner portion and a lower end of the inner portion is less than a height of the outer portion of the sleeve between the top end of the outer portion and a lower end of the outer portion.

* * * * *